United States Patent
Klepser et al.

(10) Patent No.: US 8,854,242 B1
(45) Date of Patent: Oct. 7, 2014

(54) RADIO FREQUENCY DIGITAL TO ANALOG CONVERTER

(71) Applicant: Intel Mobile Communications GmbH, Neubiberg (DE)

(72) Inventors: Bernd-Ulrich Klepser, Starnberg (DE); Franz Kuttner, St. Ulrich (AT)

(73) Assignee: Intel Mobile Communications GmbH, Neubiberg (DE)

( * ) Notice: Subject to any disclaimer, the term of this patent is extended or adjusted under 35 U.S.C. 154(b) by 32 days.

(21) Appl. No.: 13/833,031

(22) Filed: Mar. 15, 2013

(51) Int. Cl.
*H03M 1/66* (2006.01)
*H04L 27/26* (2006.01)
*H04B 7/04* (2006.01)

(52) U.S. Cl.
CPC .......... *H04B 7/0413* (2013.01); *H04L 27/2637* (2013.01)
USPC .......................................... 341/144; 375/295

(58) Field of Classification Search
USPC ....................................................... 341/144
See application file for complete search history.

(56) References Cited

U.S. PATENT DOCUMENTS

| | | | | |
|---|---|---|---|---|
| 8,111,182 B2* | 2/2012 | Kuttner | .......................... | 341/144 |
| 8,238,845 B2* | 8/2012 | Hurwitz et al. | .................. | 455/91 |
| 8,604,958 B2* | 12/2013 | Pfann et al. | .................... | 341/144 |
| 2012/0286891 A1* | 11/2012 | Schimper et al. | ............. | 332/105 |
| 2013/0251068 A1* | 9/2013 | Boos et al. | ..................... | 375/302 |

* cited by examiner

*Primary Examiner* — Khai M Nguyen
(74) *Attorney, Agent, or Firm* — Eschweiler & Associates, LLC

(57) ABSTRACT

A RF digital to analog converter has a first capacitor arrangement, a first common node, and a first controller. The first capacitor arrangement has multiple switchable capacitor paths arranged in parallel. Respective switchable capacitor paths have a switchable element and a capacitor coupled in series. The first common node is connected to the multiple switchable capacitor paths. The first controller receives a baseband signal having an in-phase component and a quadrature component, and a local oscillator (LO) signal having an in-phase LO signal and a quadrature LO signal. The first controller combines the in-phase component and the in-phase LO signal to obtain a first in-phase modulation signal and combines the quadrature component and the quadrature LO signal to obtain a first quadrature modulation signal. The first controller controls the multiple switchable capacitor paths of the first capacitor arrangement with the first in-phase modulation signal and/or the first quadrature modulation signal.

26 Claims, 6 Drawing Sheets

RADIO FREQUENCY DIGITAL TO ANALOG CONVERTER

FIELD

Implementations of the present invention relate to a radio frequency digital to analog converter and to a method for converting a digital signal to an analog signal.

BACKGROUND

Digital to analog converters (DACs=Digital to Analog Converters) may be used as modulators (e.g. as polar modulators for AM signals or as vector modulators for IQ signals). Modulators applied to transmitters of mobile communication devices serve the purpose to transfer a digital baseband signal (e.g. a data signal or audio signal) via a carrier to the base station of the communication network. In detail, the baseband signal is modulated onto the carrier, which may, for example, have a frequency of 1.8 or 2.1 MHz (depending on the network standard, cf. LTE or UMTS), such that the radio frequency output by the modulator of the transmitter complies with the frequency of the carrier and comprises the content of the baseband signal.

The group of currently used high-frequency DAC (mixers) can be broken down into a first subgroup of modulators configured to modulate a polar signal to a carrier and into a second subgroup of modulators configured to modulate an IQ signal to the carrier. Furthermore, the singular modulator types differ regarding its bandwidth, its efficiency (current consumption) and regarding additional features like MIMO capability (Multiple Input, Multiple Output). Currently, none of the known modulator types conjuncts a high signal bandwidth, a low current consumption and MIMO capability. Therefore, there is a need for an improved approach.

SUMMARY

A radio frequency digital to analog converter comprises a first capacity arrangement, a first common node and a first controller. The first capacitor arrangement comprises a plurality of switchable capacitor paths arranged in parallel, wherein each switchable capacitor path comprises a switchable element and a capacitor coupled in series. The plurality of switchable capacitor paths of the first capacitor arrangement is connected to the first common node. The first controller is configured to receive a baseband signal having an in-phase component and a quadrature component, and to receive an LO (local oscillator) signal having an in-phase LO signal and a quadrature LO signal. The first controller is further configured to combine the in-phase component and the in-phase LO signal to obtain a first in-phase modulation signal, and to combine the quadrature component and the quadrature LO signal to obtain a first quadrature modulation signal. Furthermore, the first controller is configured to control a plurality of switchable capacitor paths of the first capacitor arrangement in accordance with the first in-phase modulation signal and/or in accordance with the first quadrature modulation signal.

A radio frequency digital to analog converter comprises a first capacitor arrangement comprising a plurality of switchable capacitor paths and a second capacitor arrangement comprising a further plurality of switchable capacitor paths, each switchable capacitor path comprises an inverter and a capacitor coupled in series, wherein the switchable capacitor paths of the first capacitor arrangement are arranged in parallel and coupled to a first common node via the respective capacitors and wherein the switchable capacitor paths of the second capacitor arrangement are arranged in parallel and coupled to a second common node via the respective capacitors. The radio frequency digital to analog converter further comprises an RF-balun arranged between the first common node and the second common node, as well as a first and a second controller. The first and the second controller are configured to receive a baseband signal having an in-phase component and a quadrature component and to receive an LO signal having an in-phase LO signal and a quadrature LO signal. The first LO is configured to combine the in-phase component and the in-phase LO signal to obtain the first in-phase modulation signal, and to combine the quadrature component and the quadrature LO signal to obtain a first quadrature modulation signal, wherein the first controller is further configured to control the plurality of inverters of the first capacitor arrangement in accordance with the first in-phase modulation signal and/or in accordance with the first quadrature modulation signals. The same controller is configured to combine the in-phase component and the in-phase LO signal to obtain a second in-phase modulation signal, and to combine the quadrature component and the quadrature LO signal to obtain a second quadrature modulation signal, wherein the second controller is further configured to control the plurality of inverters of the second capacitor arrangement in accordance with the second in-phase modulation signal and/or in accordance with the second quadrature modulation signal. The radio frequency digital to analog converter is configured to output a differential analog signal comprising the in-phase component and the quadrature component between the first and the second common node in accordance with the baseband signal.

A method for converting a digital signal to an analog signal comprises the steps of receiving a baseband signal having an in-phase component and a quadrature component, and of receiving an LO signal having an in-phase LO signal and a quadrature LO signal. The method further comprises the steps of combining the in-phase component and the in-phase LO signal to obtain a first in-phase modulation signal and of combining the quadrature component and the quadrature LO signal to obtain a first quadrature modulation signal. Furthermore, the method comprises the step of controlling a plurality of switchable capacitor paths of a first capacitor arrangement in accordance with the first in-phase modulation signal and/or in accordance with the first quadrature modulation signal, wherein the first capacitor arrangement comprises the plurality of switchable capacitor paths arranged in parallel, wherein each switchable capacitor path comprises a switchable element and a capacitor coupled in series, and wherein the plurality of switchable capacitor paths of the first capacitor arrangement is connected via a first common node.

Further implementations refer to a mobile communication device comprising an above discussed radio frequency digital to analog converter and to a transmitter of a mobile communication device comprising the radio frequency digital to analog converter.

BRIEF DESCRIPTION OF THE DRAWINGS

Implementations of the present invention will be discussed below referring to the enclosed drawings, wherein.

DETAILED DESCRIPTION

Different implementations of the teachings disclosed herein will subsequently be discussed referring to FIGS. 1-4B, below. Identical reference numbers are provided to objects having identical or similar functions so that objects referred to by identical reference numbers within the different implementations are interchangeable and the description thereof is mutually applicable.

Figure 1:
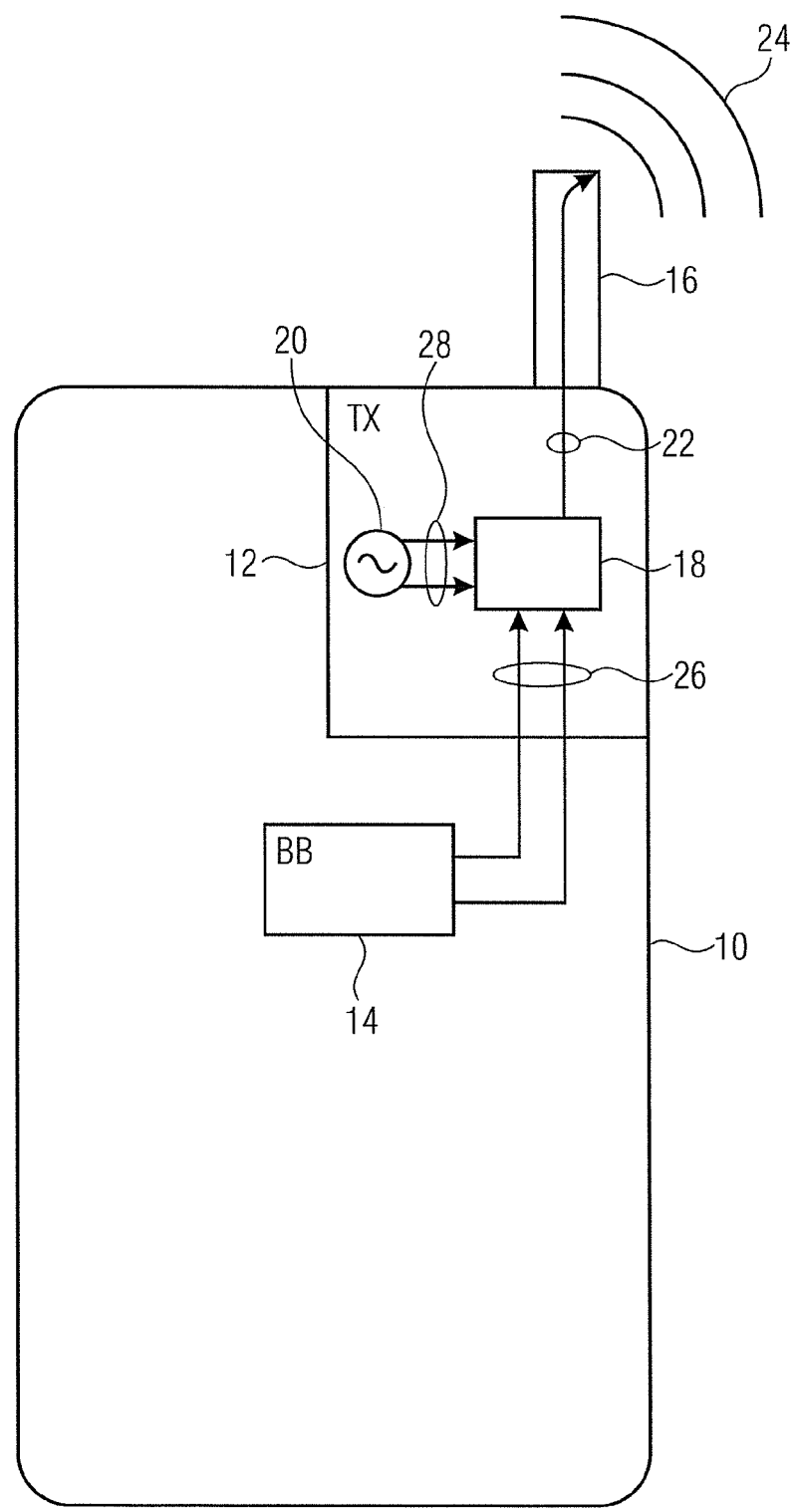
FIG. 1 shows a schematic representation of a mobile communication device comprising a radio frequency digital to analog converter implemented into a transmitter of the mobile communication device.

FIG. 1 shows a mobile communication device 10, e.g. a mobile phone, smartphone or tablet PC, comprising a transmitter 12 coupled between a baseband processor 14 and an antenna 16. The transmitter 12 comprises a modulator comprising a DAC 18 and an optional oscillator 20 (e.g. a modulated DCO (Digital Controlled Oscillator)). The DAC 18 (modulator) may be formed by a radio frequency digital to analog converter (RF-DAC).

The transmitter 12 is configured to transmit a communication signal 24 (e.g. an analog radio frequency signal) over the air via the antenna 16, wherein the communication signal 24 is equal to or based on a radio frequency signal 22 output by the DAC 18. The transmitter may optionally comprise further signal processing units (not shown), like amplification stages, arranged between the DAC 18 and the antenna 16 for processing the RF signal 22. The analog RF signal 22 to be transmitted may comprise an audio signal or a data signal based on a signal 26 provided by the baseband processor 14. The baseband processor 14 provides the baseband signal 26 in digital form, for example as an IQ signal. The baseband IQ signal 26 comprises an in-phase component and a quadrature component which should be modulated onto a carrier (e.g. a 2.1 MHz carrier) having a frequency and bandwidth defined by the used communication network standard. The modulation is performed by the DAC 18 (modulator) which combines the baseband signal 26 with an LO signal 28 (oscillator signal) provided by the oscillator 20. It should be noted that the LO signal 28 (e.g. having a frequency of 2 GHz) may be a derivate signal of a signal (e.g. having a frequency of 8 GHz) directly output by the oscillator 20. In detail, the IQ modulation, also referred to as vector modulation, is performed by combining the first in-phase component of the baseband signal 26 with the respective in-phase LO signal of the LO signal 28 and by combining the quadrature component of the baseband signal 26 with the respective quadrature LO signal of the LO signal 28.

Currently, multiple architectures for the DACs 18 (modulators) are used depending on the respective requirements. For example, a direct modulator (vector modulator architecture) is mostly chosen when a large modulation bandwidth is required (e.g. in case of carrier aggregation in LTE or WiFi 11n). However, the direct modulator architecture does not offer the best efficiency. Another drawback is the noise behavior and the chip area consumption of such direct modulators. An improvement regarding the efficiency may be achieved by choosing a current steering IQ RF DAC as modulator which typically comprises a plurality of mixer cells, wherein a first subplurality of these mixer cells is designed as in-phase mixer cells and a further subplurality of the mixer cells is designed as quadrature mixer cells. However, this current steering IQ RF DAC has a medium efficiency. Therefore, there is a need for an improved approach such that the efficiency of the DAC 18 (modulator) may be increased while maintaining the high bandwidth.

Below, implementations of RF DACs (used as modulator for the communication device 10) enabling high efficiency will be discussed.

Figure 2:
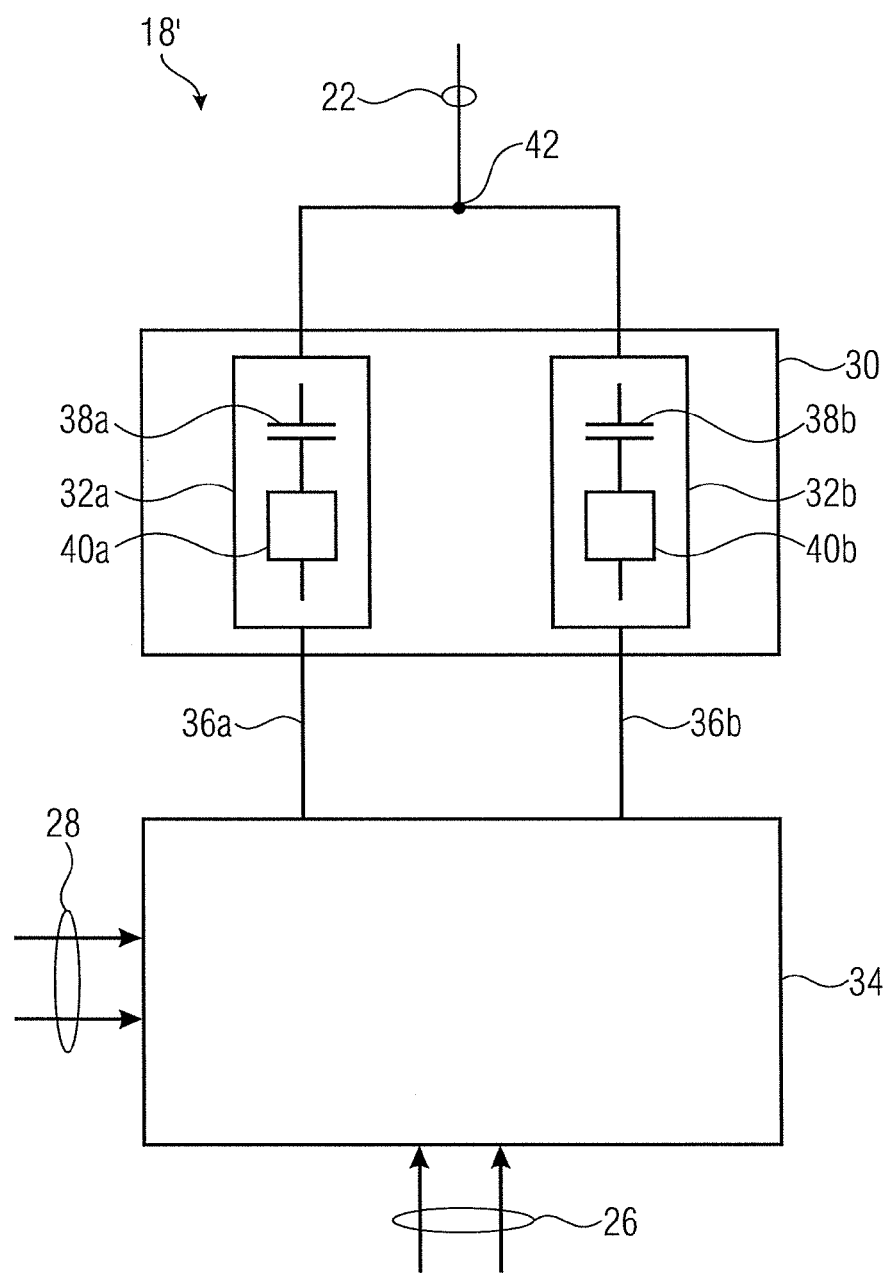
FIG. 2 shows a block diagram of a first implementation of the radio frequency digital to analog converter.

FIG. 2 shows an implementation of a DAC 18' having an improved architecture. The DAC 18' comprises a first capacitor arrangement 30 comprising a plurality of switchable capacitor paths 32a and 32b. Furthermore, the DAC 18' comprises a first controller 34 which is coupled to the singular switchable capacitor paths 32a and 32b in a signal technical manner. Therefore, the controller 34 comprises an output 36a and 36b for each switchable capacitor path 32a and 32b, respectively.

Respective switchable capacitor paths, 32a and 32b, comprise a capacitor, 38a and 38b, as well as a switchable element, 40a and 40b. In each switchable capacitor path 32a or 32b a respective capacitor 38a or 38b and a respective switchable element 40a or 40b is coupled in series. Via the switchable element 40a and 40b, respectively, one side of the capacitor 38a or 38b may be coupled to the known electrical potential when enabling the switchable element 40a or 40b. At the second side, the plurality of capacitors 38a and 38b of the switchable capacitor paths 32a or 32b may be connected to each other via a common node 42 so that the plurality of switchable capacitor paths 32a and 32b are coupled in parallel. From another point of view that means that an electrical signal may be output via the common node 42 wherein the amplitude of the signal depends on the number of enabled switchable elements 40a and 40b. The switchable element 40a and 40b of each switchable capacitor path 32a and 32b may be formed by an inverter or by another circuit comprising one or more transistors which enables the switchable electrical coupling of the capacitors 38a or 38b to the known electrical potential. The switchable elements 40a and 40b are controlled via a (binary) control signal output by the controller 34 via the control outputs 36a and 36b.

The controller 34 controls the plurality of switchable capacitor paths, 32a and 32b, such that an IQ modulated radio frequency signal is output by the capacitor arrangement 30 via the common node 42. For this purpose, the controller 42 is configured to combine a local oscillator signal 28 (LO signal) and a baseband signal 26, which respectively comprise an in-phase component (I) and a quadrature component (Q). The digital baseband signal 26 is provided by the baseband processor (not shown) in a manner comparable to the so-called IF signals in case for AM modulations. These baseband signals 26 and LO signals 28 are combined in the digital domain, so that the LO signals 28 (originally used for phase modulation) are no longer modulated, but provide a 0°- and/or 90°-constant phase at the RF frequency. Based on the combinations of the baseband signal 26 and the LO signal 28 a so-called in-phase modulation signal and/or a so-called quadrature modulation signal is generated. In accordance with the in-phase modulation signal and/or in accordance with the quadrature modulation signal and/or in accordance with a signal combining these two signals the singular switchable elements 40a and 40b are selectively enabled by outputting the respective control signals via the control outputs 36a and 36b. In other words, that means that the mixing function is now fully digitally implemented into the controller 34. Thus, the mixing performed by the controller 34 (without classical mixer stage) occurs by the phase of the LO signal 28, wherein the result of the mixing is a digitally coded number of inverter signals. The functionality of the controller 34 (decoder), especially with regard to the logic implemented into the controller 34 will be discussed referring to FIG. 3B.

Dependent on the combination of the baseband IQ signals 26 with the LO IQ signals 28 a number of switchable capacitor paths 32a and 32b are enabled in parallel via the control signals provided to control outputs 36a and 36b, wherein the number of enabled (and disabled) switchable capacitor paths 32a and 32b is varied over time in order to output a time signal. Consequently, the first capacitor arrangement 30 of the DAC 18' outputs the modulated RF signal (comprising an in-phase component as well as the quadrature component (cf. baseband signal 26) modulated on a carrier (cf. LO signal 28)) dependent on the number of enabled switchable elements 40a and 40b and dependent on the chronological sequence of the combinations of enabled switchable elements 40a and 40b of the capacitor arrangement 30. This means that DAC 18' acts as a so-called direct modulator for IQ signals having a capacitor RF-DAC circuit architecture is formed. In other words, the invention implements the digital IQ modulator as DAC 18' based on elementary mixer cells, comprising switchable capacitor paths 32a and 32b, of a capacitive RF-DAC, wherein the mixing function is implemented into the controller 34 (decoder). The direct modulator of DAC 18' may profitably have a large tuning range (e.g. a tuning range above 500 MHz exceeding the LTE20 requirements), in combination with a frequency modulation in order of 60 MHz or above (i.e. 4×60 MHz=240 MHz at DCO frequency). This enables a large modulation bandwidth used for a carrier aggregation LTE or WiFi 11n. To sum up, the advantage is that the capacitive modulator of DAC 18' combines a high bandwidth resulting in a large tuning signal range with a high efficiency. Since the architecture of the modulator of DAC 18' is based on a non-modulated LO path, a further advantage is that it can also be used in multiple, simultaneous transmitter applications like MIMO using a synthesizer.

It should be noted that the shown capacitor arrangement 30 may, according to further implementations, comprise more than the illustrated two switchable capacitor paths 30a and 30b (e.g. 512 capacitor paths enabling a 9-bit DA converting).

As described below, the switchable elements may be realized by inverters 40a and 40b. An inverter 40a and 40b typically comprises two transistors of two different transistor types (e.g. n-type and p-type) coupled to each other such that the control contacts (gate contacts) of both are coupled to a common input and an output contacts (drain contacts) of both are coupled to a common output, wherein the supply voltage for the inverter circuit is applied between the two respective input contact (source contacts) of transistors. Often, an inverter, also referred to as not-gate, is realized by CMOS technologies, so that the first transistor is formed by a P-MOSFET, wherein the second transistor is formed by an N-MOSFET.

Figure 3A:
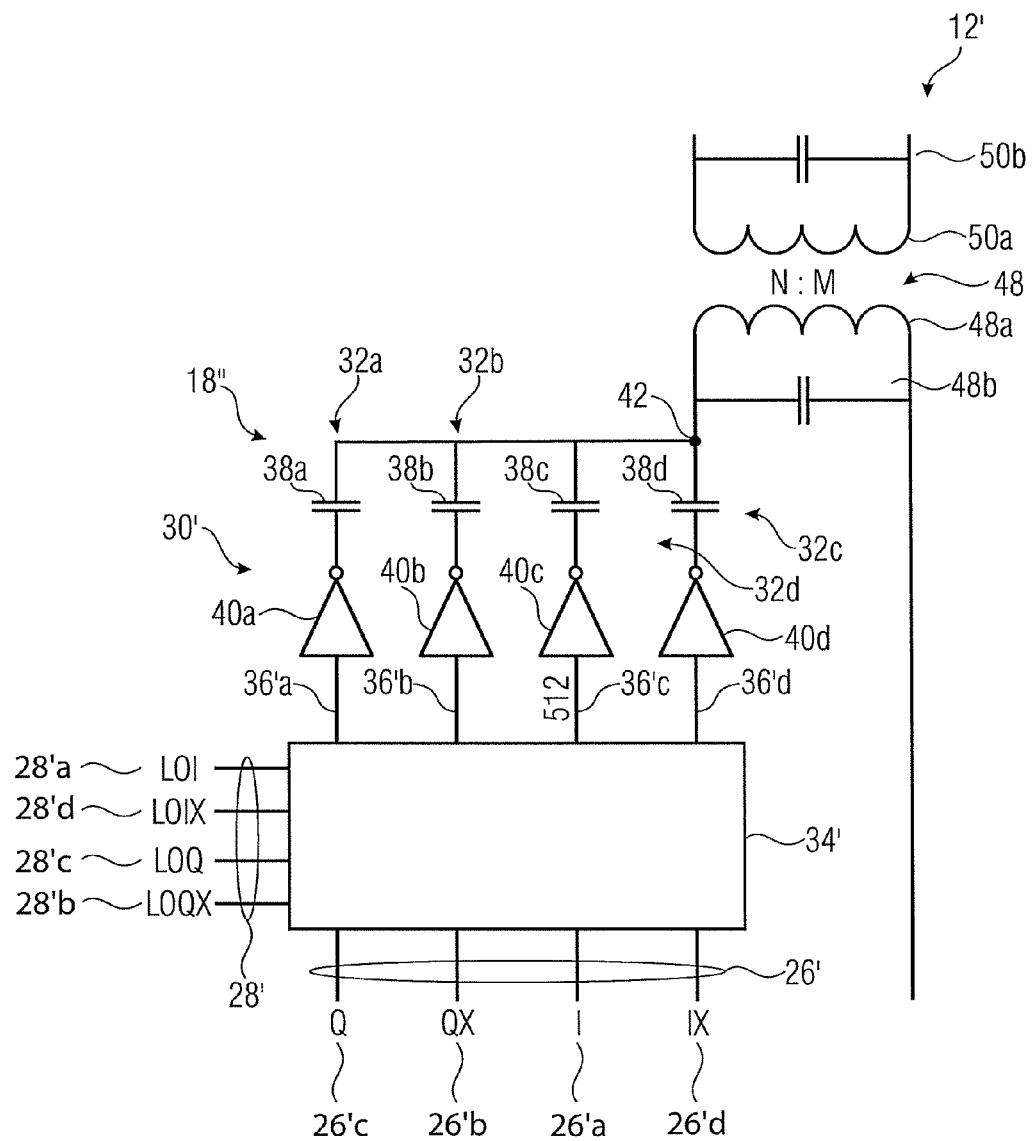
FIG. 3A shows a schematic block diagram of a further implementation of the radio frequency digital to analog converter designed for outputting a single-ended signal.

FIG. 3A shows a RF DAC 18" (direct modulator) implemented along with a transmitter 12' configured for a single-ended transmission. The transmitter 12' comprises an RF-balun 48 and the RF DAC 18" having a controller 34'.

The RF-balun 48 comprises a first inductivity 48a and a first capacity 48b coupled in parallel. The first inductivity 48a may have n windings. With this first inductivity 48a, a second inductivity 58a may be coupled inductively, wherein the second inductivity 50a is typically combined with a further second capacity 50b connected in parallel to same. The second inductivity 50a may comprise m windings so that a transformer is formed by the two inductively coupled inductivities 48a and 50a. The RF-balun 48 is connected at a first side to the RF DAC 18" via a common node 42, wherein the second side may be left floating. In this implementation, the plurality of switchable capacitor paths 32a, 32b, 32c and 32d are coupled to the common node 42 via the capacitors 38a, 38b, 38c and 38d, respectively.

The plurality of elementary mixer cells, comprising switchable capacitor paths 32a, 32b, 32c and 32d, are enabled and disabled by the controller 34' via the inverters 40a, 40b, 40c and 40d. In contrast to the DAC 18' of FIG. 2 controlled by the controller 34 in order to output a 50% duty cycle, the DAC 18" of FIG. 3A may be controlled by 34' such that signal corresponding to a signal having a 25% duty cycle (or different duty cycles) may be output via the RF-balun 48.

Therefore, the controller 34' (decoder) comprises four inputs for the baseband signal 26', namely one for the in-phase component (I), one for the inverted in-phase component (IX), one for the quadrature component (Q) and one for the inverted quadrature component (QX). The controller 34' further comprises four inputs for the LO signal 28', each 90° dephased (cf. LOI, LOIX, LOQ, LOQX), corresponding to I, IX, Q, QX. Thus, the controller 34' is configured to control the switchable capacitor paths 32a, 32b, 32c and 32d of the capacitor arrangement 30', in accordance to a two-part in-phase modulation signal representing the combination of I, IX, LOI and LOIX and/or in accordance to a two-part quadrature modulation signal representing the combination of Q; QX, LOQ and LOQX, via binary control signals 36'a, 36'b, 36'c and 36'd such that a modulated RF signal corresponding to a 25% duty cycle signal is output to the RF-balun 48. For the sake of completeness, it should be noted that the RF signal modulated onto a carrier signal comprising LO signal 28' consequently comprises the in-phase component (I), the quadrature component (Q) and the inverted versions of same (IX, QX). Here, the baseband signal 26' and the LO signal 28' may be combined such that the common mode is rejected, in more detail, such that a common mode within the modulated RF signal is reduced or even avoided.

Figure 3B:
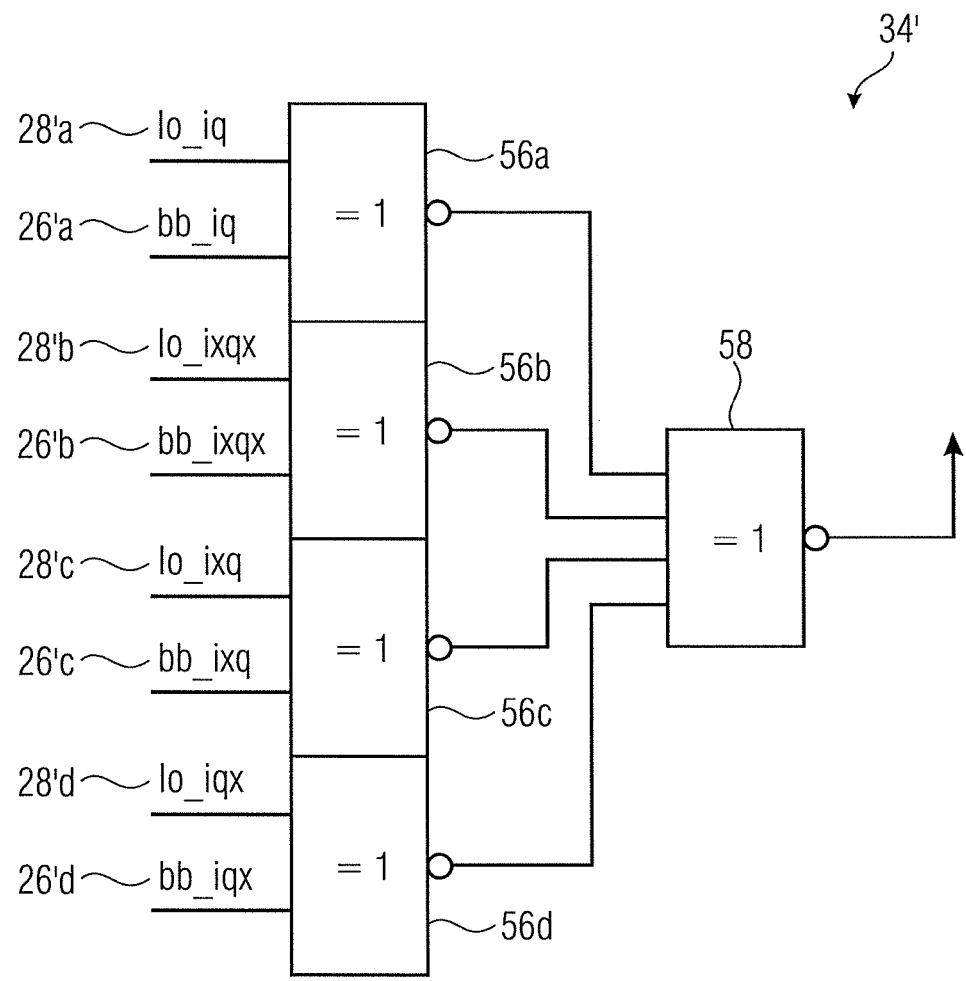
FIG. 3B shows a schematic block diagram of a controller of the radio frequency digital to analog converter shown in FIG. 3A.

Below, the logic of the controller 34' for outputting a 25% duty cycle equivalent will be discussed. FIG. 3B shows a possible implementation of the logic of the controller 34' comprising four logical elements/operations (e.g. XNOR-operations or AND-operations), namely a first logical element 56a, a second logical element 56b, a third logical element 56c, and a fourth logical element 56d. The first logical element 56a combines a first baseband signal 26'a (bb_iq) (e.g. a single-bit signal) and a first LO signal 28'a (lo_iq). The second logical element 56b combines a second baseband signal 26'b (bb_ixqx) and a second LO signal 28'b (lo_ixqx). The third logical element 56c combines a third baseband signal 26'c (bb_ixq) and a third LO signal 28'c (lo_ixq). The fourth logical element 56d combines a fourth baseband signal 26'd (bb_iqx) and a fourth LO signal 28'd (lo_iqx). The four logical elements 56a, 56b, 56c and 56d output the respective combined signals to a fifth logical element 58 (e.g. to a further AND-element). The fifth logical element 58 is configured to combine the received signals which represent a combination of the respective in-phase component and the quadrature-phase component with the in-phase oscillation signal and the quadrature oscillation signal to obtain the in-phase modulation signal and/or the quadrature modulation signal and/or a signal combining these two signals. In accordance to these modulation signals the controller 34' selectively enables the singular capacitor paths (not shown) of the capacitor arrangement via binary control signals.

According to further implementations, the shown controller 34' (decoder) configured to combine the LO signals 28' and the baseband signals 26' may be formed as a software implemented unit. Thus, the above-described combining of the baseband signals 26' and the LO signals 28' may be, at least partially, performed by a processing unit like a CPU.

Figure 4A:
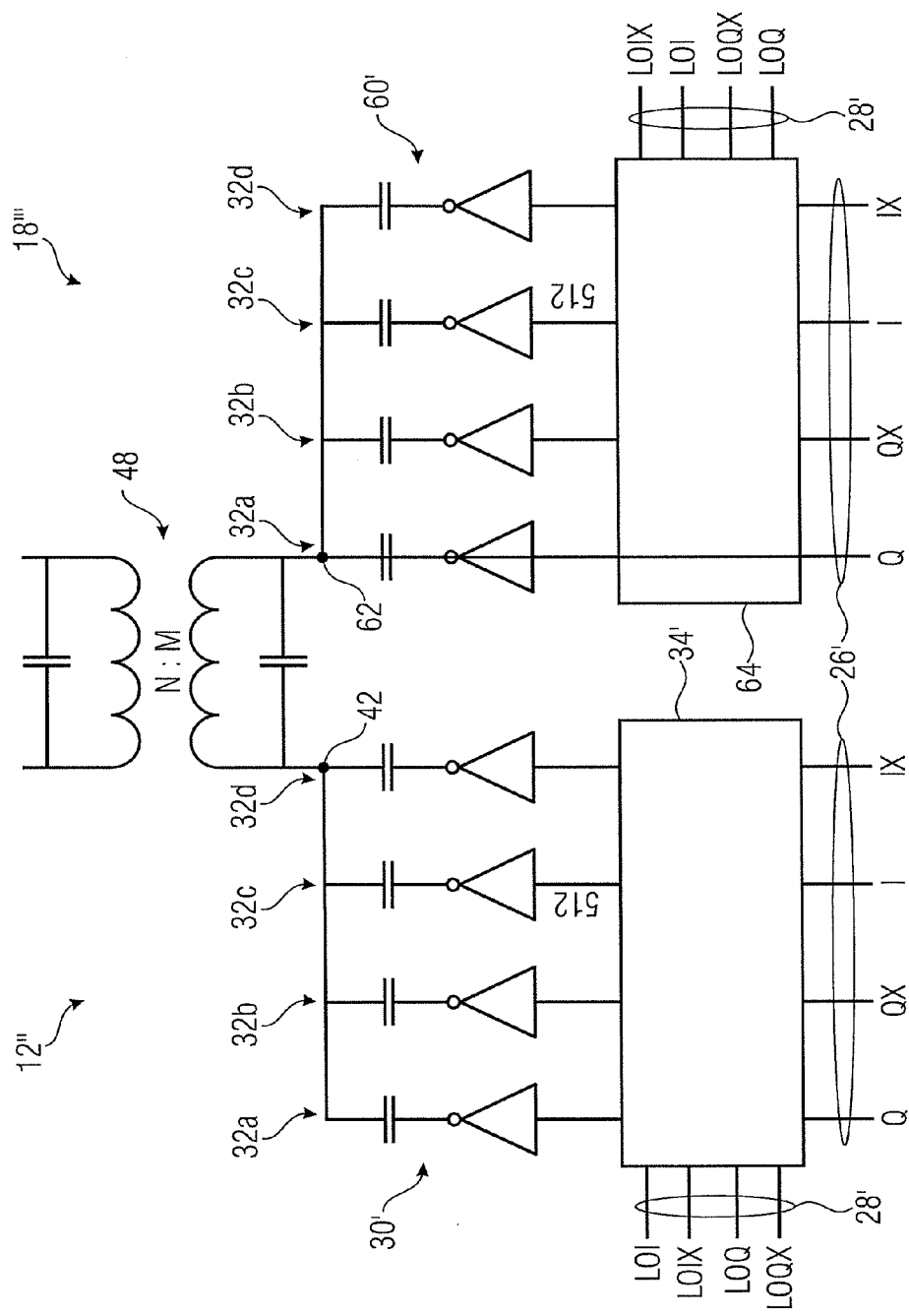
FIG. 4A shows a schematic block diagram of an implementation of the radio frequency digital to analog converter designed for outputting a differential signal.

FIG. 4A shows a further implementation of a DAC 18'''' with a transmitter 12'' that is configured to output a differential signal. The shown DAC 18'''' (modulator) comprises the first capacitor arrangement 30' comprising the plurality of switchable capacitor paths 32a, 32b, 32c and 32d which are coupled via the common node 42. The switchable capacitor paths 32a, 32b, 32c and 32d of the first capacitor arrangement 30' are controlled via the controller 34', as explained above.

The DAC 18'''' further comprises a second capacitor arrangement 60, which is substantially equal to the first capacitor arrangement 30', wherein the switchable capacitor paths 32a, 32b, 32c and 32d are coupled to a second common node 62. The two capacitor arrangements 30' and 60' are coupled to each other via the RF-balun 48. For example, the first capacitor arrangement 30' is connected to the RF-balun 48 at a first side via the first common node 42, wherein the second capacitor arrangement 60 is connected to the RF-balun 48 to the second side via the second common node 62. The second capacitor arrangement 60 is controlled via a second controller 64 which is also substantially similar to the first controller 34'.

The controlling of the second capacitor arrangement 60 is based on the baseband signal 26' and the LO signal 28'. The second controller 64 is configured to receive the baseband signal 26' comprising the in-phase component and the quadrature component as well as the LO signal 28', wherein the terminal assignment may differ from the first capacitor arrangement 30'. The second capacitor arrangement 60 should be controlled such that the RF signal output via the second common node 62 is (regarding its value) similar or even equal to the RF signal output by the capacitor arrangements 30' via the first common node 42, but inverted. Thus, the signal applied between the two common nodes 42 and 62 is a differential signal. The logic of the controller 64 for controlling the second capacitor arrangement 60 will be discussed in detail referring to FIG. 4B.

Figure 4B:
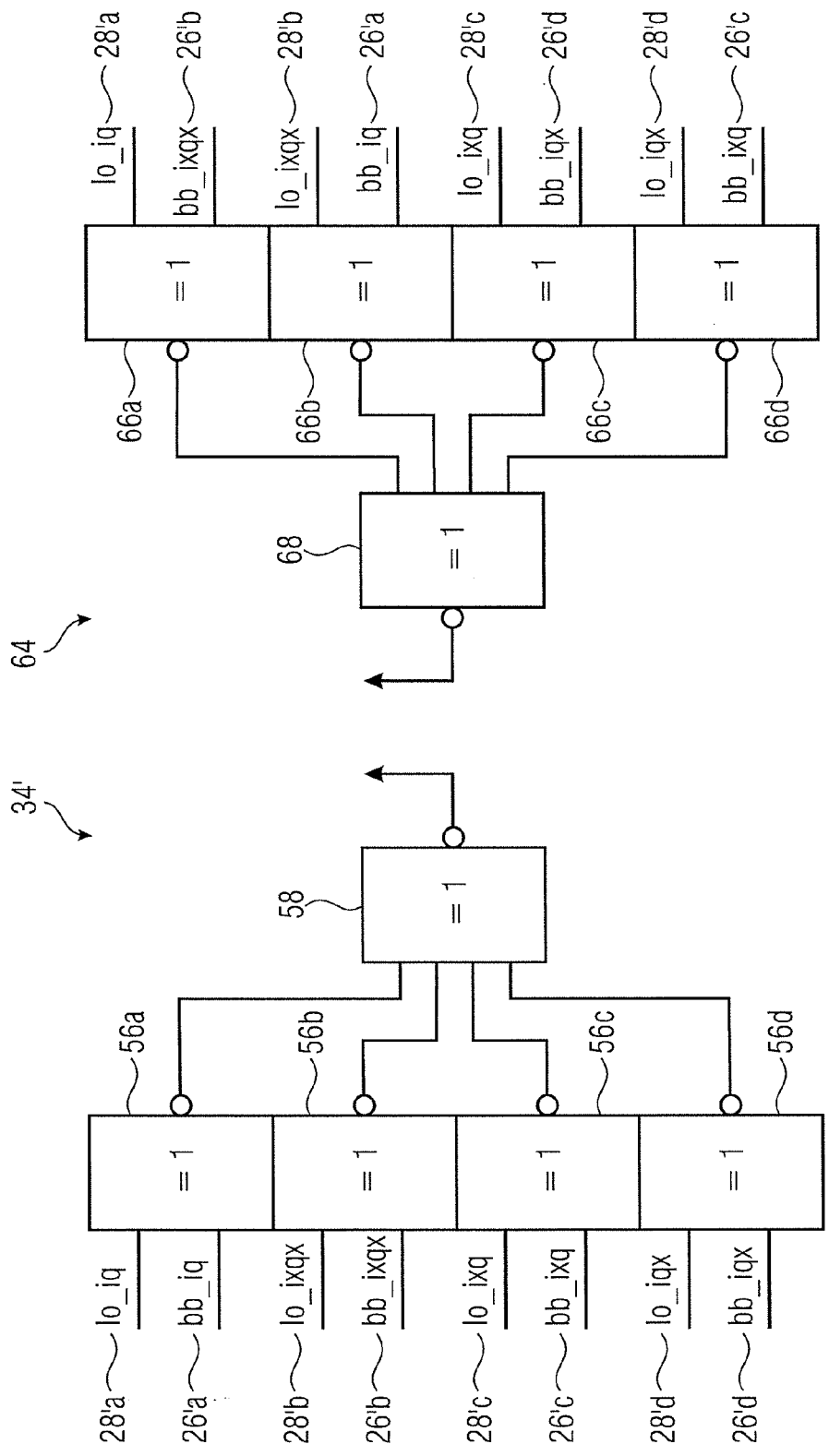
FIG. 4B shows a schematic block diagram of a controller of the radio frequency digital to analog converter shown in FIG. 4A.

FIG. 4B illustrates logical combinations of the two controllers 34' and 64. The logical combinations of the first controller 34' correspond to the logical combinations discussed referring to FIG. 3B. The second controller 64 also comprises four logical elements 66a, 66b, 66c and 66d (e.g. AND-operators) and a fifth logical element 68 which is connected to the four logical elements 66a, 66n, 66c and 66d. The first logical element 66a is configured to combine the second baseband signal 26'b (bb_ixqx) and the first LO signal 28'a (lo_iq). The second logical element 66b is configured to combine the first baseband signal 26'a (bb_iq) and the second LO signal 28'b (lo_ixqx). The third logical element 66c is configured to combine the fourth baseband signal 26'd (bb_iqx) and the third LO signal 28'c (lo_ixq). The fourth logical element 66d is configured to combine the fourth baseband signal 26'c (bb_ixq) and the fourth LO signal 28'd (lo_iqx). These four signals are combined by the fifth logical elements 68 to output a combination of the in-phase modulation signal and/or of the quadrature-phase modulation signal of based on which the controlling of the second capacitor arrangement (not shown) may be performed. Thus, the four logical element 66a, 66b, 66c and 66d combine the 180° de-phased versions of the baseband signals 26' (cf. logical elements 56a, 56b, 56c and 56d).

According to further implementation, the control logic may be configured to combine a plurality of baseband signals with a plurality of LO signals in parallel, such that the RF signal output by the plurality of elementary mixer cells, comprising switchable capacitor paths 32a, 32b, 32c and 32d, comprises a plurality of component carriers (e.g. in case carrier aggregation). Starting from the structure of controller 34', shown by FIG. 3A, the controller 34' (decoder) receives a first baseband signal 26'a comprising an in-phase component I and a quadrature component Q and a second baseband signal 26'b comprising a further in-phase component IX and a further quadrature component QX, and combines these two baseband signals 26'a and 26'b with two LO signals 28'a and 28'b. In detail, the first baseband signal 26'a is combined with the first LO signal 28'a comprising an in-phase LO signal LOI and an quadrature LO signal LOQ, wherein the second baseband signal 26'b is combined with the second LO signal 28'b comprising an in-phase LO signal LOIX and an quadrature LO signal LOQX. Thus, the modulation of two baseband signals 26'a and 26'b by using two LO signals 28'a and 28'b is performed in the digital domain.

With respect to the controlling means comprising the controller 34' and controller 64, i.e. that the controlling of the two different capacitor arrangements 30' and 60 may be based on the same input signals, namely the baseband signal 26' and the LO signal 28', wherein a different logical combination of the singular path signals of the baseband signal 26' and the LO signal 28' is used for the second controller 64 when compared to the first controller 34'. According to another implementation the two controllers, 34' and 64, may be combined to a central controller which controls the two capacitor arrangements.

It should be noted the controlling of the DAC 18'' is not limited to the above discussed logic, so, according to another implementation of the controllers 34' and 64, also another combination of the singular IQ and LO signals may be feasible, wherein the second controller 64 typically combines a de-phased version of the signals combined by the first controller 34'.

According to another implementation, controllers 34, 34', 64 or the combined controller comprising the controllers 34' and 64 may be implemented as a two-stage version. The two-stage version comprises a central controller and a plurality of controllers which are arranged next to a respective switchable capacitor path 32a, 32b, 32c or 32d. In general, it should be noted that the arrangement of the controllers 34, 34' and 64 is selected such that the signal path between a respective controller 34, 34' and 64 to a respective inverter 40a, 40b, 40c or 40d to be controlled is minimized.

Furthermore, it should be noted that the controllers 34, 34' and 64 are not necessarily arranged within the transmitters 12, 12' or 12''. Thus, the controllers 34, 34' and 64 may be, for example, integrated into an upstream unit (e.g. into the baseband processor).

Referring to FIG. 1, it should be noted that the shown transmitter 12 may have MIMO capability when of the discussed implementations of DACs 18', 18'' or 18'''' is implemented. Therefore, the controllers 34, 34', 34'' and 64 may be configured to perform the controlling of the capacitor arrangements 30', 60 such that multiple IQ data may be modulated onto the carrier output via the respective capacitor arrangements 30' and 60.

Regarding FIGS. 3A and 4A it should be noted that the capacitances of the plurality of capacitors 38a, 38b, 38c and 38d of the capacitor arrangement 30' and/or 60 are preferably equal (thermometer coded arrangement). According to a further implementation, the capacitor arrangements 30' and/or

60 may have an additional switchable capacitor path having a reduced capacitance in order to enable a DA converting having an increased accuracy. The capacitance of this additional switchable capacitor path may, for example, be equal to the half of the capacitance of the other capacitors 38*a*, 38*b*, 38*c* and 38*d*. According to another implementation, the capacitor arrangement 30' and/or 60 may comprise further switchable capacitor paths having a further reduced capacitance (e.g. a quarter of the original capacitance of one of the capacitors 38*a*, 38*b*, 38*c* and 38*d*) for further increasing the accuracy of the DA converting. According to another implementation a capacitance of each of the plurality of capacitors 38*a*, 38*b*, 38*c* and 38*d* of the capacitor arrangements 30' and/or 60 may increase from one capacitor to a subsequent capacitor, e.g. by a factor of 2 (binary coded arrangement).

Although, in the above implementations the capacitor arrangement 30' and/or 60' is illustrated as a capacitor arrangement comprising 512 capacitor paths. It should be noted that also more or less capacitor paths may be provided, wherein the resolution of the digital to analog converting depends on the number of capacitor paths.

Also, in the above implementations the digital to analog converters 18, 18', 18" and 18''' are shown as a modulator which is configured to modulate a RF signal based on an IQ signal, it should be noted that the shown modulator may also have a second mode in which the RF signal output by the DACs 18, 18', 18" or 18''' is based on polar signals, wherein the phase signal is provided as a phase shift in the LO signal. Thus, the controllers 34, 34' and 62' may be configured to control the switchable capacitor paths 32*a*, 32*b*, 32*c* or 32*d* based on a vector signal in the first mode and based on a polar signal in the second mode.

Although some aspects have been described in the context of an apparatus, it is clear that these aspects also represent a description of the corresponding method for operating a DAC or for controlling a capacitor arrangement 30, 30' and/or 60 of DAC or, in general, for converting an analog signal to a digital signal. Here, a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some implementations, some one or more of the most important method steps may be executed by such an apparatus.

Depending on certain implementation requirements, implementations of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some implementations according to the invention comprise a data carrier having electronically readable control signals, which are capable of cooperating with a programmable computer system, such that one of the methods described herein is performed.

Generally, implementations of the present invention can be implemented as a computer program product with a program code, the program code being operative for performing one of the methods when the computer program product runs on a computer. The program code may for example be stored on a machine readable carrier.

Other implementations comprise the computer program for performing one of the methods described herein, stored on a machine readable carrier.

In other words, an implementation of the inventive method is, therefore, a computer program having a program code for performing one of the methods described herein, when the computer program runs on a computer.

A further implementation of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the inventive method is, therefore, a data stream or a sequence of signals representing the computer program for performing one of the methods described herein. The data stream or the sequence of signals may for example be configured to be transferred via a data communication connection, for example via the Internet.

A further implementation comprises a processing means, for example a computer, or a programmable logic device, configured to or adapted to perform one of the methods described herein.

A further implementation comprises a computer having installed thereon the computer program for performing one of the methods described herein.

A further implementation according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some implementations, a programmable logic device (for example a field programmable gate array) may be used to perform some or all of the functionalities of the methods described herein. In some implementations, a field programmable gate array may cooperate with a microprocessor in order to perform one of the methods described herein. Generally, the methods are preferably performed by any hardware apparatus.

The above described implementations are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the implementations herein.

The invention claimed is:

1. A radio frequency digital to analog converter, comprising:
　a first capacitor arrangement comprising a plurality of switchable capacitor paths arranged in parallel, wherein each switchable capacitor path comprises a switchable element and a capacitor coupled in series;
　a first common node connected to the plurality of switchable capacitor paths of the first capacitor arrangement; and
　a first controller configured to receive a baseband signal having an in-phase component and a quadrature component, and to receive an LO (local oscillator) signal having an in-phase LO signal and a quadrature LO signal, wherein the first controller is configured to combine the in-phase component and the in-phase LO signal to obtain a first in-phase modulation signal, and to combine the quadrature component and the quadrature LO signal to obtain a first quadrature modulation signal, wherein the first controller is configured to control the plurality of switchable capacitor paths of the first capacitor arrangement in accordance with the first in-phase modulation signal or in accordance with the first quadrature modulation signal.

2. The radio frequency digital to analog converter according to claim 1, wherein the switchable element comprises an inverter.

3. The radio frequency digital to analog converter according to claim 1, wherein the radio frequency digital to analog converter is configured to output a modulated in-phase signal or a modulated quadrature signal via the first common node, wherein a value of the modulated in-phase signal or a value of the modulated quadrature signal depends on a number of enabled switchable elements of the first capacitor arrangement.

4. The radio frequency digital to analog converter according to claim 3, wherein the first controller controls the switchable elements such that the modulated in-phase signal and the modulated quadrature signal are output in accordance with an averaged duty cycle of 50%.

5. The radio frequency digital to analog converter according to claim 1, further comprising an RF-balun connected to the first common node via a first side of the RF-balun.

6. The radio frequency digital to analog converter according to claim 5, wherein the RF-balun comprises at least one inductivity and at least one capacity connected in parallel.

7. The radio frequency digital to analog converter according to claim 1, wherein the in-phase component comprises two in-phase component parts, wherein the quadrature component comprises two quadrature component parts, wherein the in-phase LO signal comprises two in-phase LO signal parts, and wherein the quadrature LO signal comprises two quadrature LO signal parts.

8. The radio frequency digital to analog converter according to claim 7, wherein the first controller is configured to combine the two in-phase component parts and the two in-phase LO signal parts, and to combine the two quadrature component parts and the two quadrature LO signal parts such that modulated in-phase signals or modulated quadrature signals output via the first common node are output.

9. The radio frequency digital to analog converter according to claim 1, wherein the first controller is configured to combine a further in-phase component to be modulated onto a further carrier and a further in-phase LO signal to obtain an further in-phase modulation signal, and to combine a further quadrature component to be modulated onto the further carrier and a further quadrature LO signal to obtain a further quadrature modulation signal.

10. The radio frequency digital to analog converter according to claim 1, wherein the plurality of switchable capacitor paths is coupled to the first common node via the respective capacitor.

11. The radio frequency digital to analog converter according to claim 1, wherein each capacitor of the plurality of the capacitor paths has an equal capacity.

12. The radio frequency digital to analog converter according to claim 1, wherein a capacitor of a second of the plurality of capacitor paths has a capacity which is increased over a capacity of a previous one of the plurality of capacitor paths.

13. The radio frequency digital to analog converter according to claim 1, wherein at least one capacitor of one of the plurality of switchable capacitor paths has a reduced capacity when compared to a capacity of another capacitor of another of the switchable capacitor paths, wherein the reduced capacity is reduced by at least 25%.

14. The radio frequency digital to analog converter according to claim 1, wherein the first controller comprises one central controller and a plurality of sub-controllers, which are arranged between the central controller and the respective switchable element to be controlled.

15. The radio frequency digital to analog converter according to claim 1, which is configured to output a single ended analog signal via the first common node in accordance with the baseband signal.

16. The radio frequency digital to analog converter according to claim 15, wherein the single ended analog signal is modulated to a carrier frequency which depends on the LO signal.

17. The radio frequency digital to analog converter according to claim 1, comprising:

a second capacitor arrangement comprising a plurality of switchable capacitor paths arranged in parallel, wherein each switchable capacitor path comprises a switchable element and a capacitor coupled in series;

a second common node connected to the plurality of switchable capacitor paths of the second capacitor arrangement; and a second controller configured to receive the baseband signal and the LO signal, wherein the second controller is configured to combine the in-phase component and the in-phase LO signal to obtain a second in-phase modulation signal, and to combine the quadrature component and the quadrature LO signal to obtain a second quadrature modulation signal, and wherein the second controller is configured to control the plurality of switchable capacitor paths of the second capacitor arrangement in accordance with the second in-phase modulation signal or in accordance with the second quadrature modulation signal.

18. The radio frequency digital to analog converter according to claim 17, wherein the radio frequency digital to analog converter is configured to output a differential analog signal between the first and the second common node in accordance with the baseband signal.

19. The radio frequency digital to analog converter according to claim 17, further comprising an RF-balun arranged between the first and the second common node.

20. The radio frequency digital to analog converter according to claim 17, wherein the first controller is different from the second controller or wherein a terminal assignment of input terminals for receiving the LO signal of the first controller differs from a terminal assignment of input terminals for receiving the LO signal of the second controller.

21. The radio frequency digital to analog converter according to claim 17, wherein the first controller and the second controller are integrated into a central controller.

22. A radio frequency digital to analog converter comprising:

a first capacitor arrangement comprising a plurality of switchable capacitor paths and a second capacitor arrangement comprising a further plurality of switchable capacitor paths, each switchable capacitor path comprises an inverter and a capacitor coupled in series, wherein the switchable capacitor paths of the first capacitor arrangement are arranged in parallel and coupled to a first common node via respective capacitors and wherein the switchable capacitor paths of the second capacitor arrangement are arranged in parallel and coupled to a second common node via the respective capacitors;

an RF-balun arranged between the first common node and the second common node; and a first controller and a second controller, wherein the first controller and the second controller are configured to receive a baseband signal having an in-phase component and a quadrature component, and to receive an LO signal having an in-phase LO signal and a quadrature LO signal, wherein the first controller is configured to combine the in-phase component and the in-phase LO signal to obtain a first in-phase modulation signal, and to combine the quadrature component and the quadrature LO signal to obtain a first quadrature modulation signal, and wherein the first controller is configured to control the plurality of inverters of the first capacitor arrangement in accordance with the first in-phase modulation signal or in accordance with the first quadrature modulation signal, wherein the second controller is configured to combine the in-phase component and the in-phase LO signal to obtain a second in-phase modulation signal, and to combine the quadrature component and the quadrature LO signal to obtain a second quadrature modulation signal, and wherein the second controller is configured to control the plurality of inverters of the second capacitor arrangement in accordance with the second in-phase modulation signal or in accordance with the second quadrature modulation signal;

wherein the radio frequency digital to analog converter is configured to output a differential analog signal comprising the in-phase component and the quadrature component between the first and the second common node in accordance with the baseband signal.

23. A transmitter of a mobile communication device comprising:

an antenna; and a radio frequency digital to analog converter coupled to the antenna, wherein the radio frequency digital to analog converter comprises:

a first capacitor arrangement comprising a plurality of switchable capacitor paths and a second capacitor arrangement comprising a further plurality of switchable capacitor paths, each switchable capacitor path comprises an inverter and a capacitor coupled in series, wherein the switchable capacitor paths of the first capacitor arrangement are arranged in parallel and coupled to a first common node via respective capacitors and wherein the switchable capacitor paths of the second capacitor arrangement are arranged in parallel and coupled to a second common node via the respective capacitors;

an RF-balun arranged between the first common node and the second common node; and a first controller and a second controller, wherein the first controller and the second controller are configured to receive a baseband signal having an in-phase component and a quadrature component, and to receive an LO signal having an in-phase LO signal and a quadrature LO signal, wherein the first controller is configured to combine the in-phase component and the in-phase LO signal to obtain a first in-phase modulation signal, and o combine the quadrature component and the quadrature LO signal to obtain a first quadrature modulation signal, and wherein the first controller is configured to control the plurality of inverters of the first capacitor arrangement in accordance with the first in-phase modulation signal or in accordance with the first quadrature modulation signal, wherein the second controller is configured to combine the in-phase component and the in-phase LO signal to obtain a second in-phase modulation signal, and to combine the quadrature component and the quadrature LO signal to obtain a second quadrature modulation signal, and wherein the second controller is configured to control the plurality of inverters of the second capacitor arrangement in accordance with the second in-phase modulation signal or in accordance with the second quadrature modulation signal;

wherein the radio frequency digital to analog converter is configured to output a differential analog signal comprising the in-phase component and the quadrature component between the first and the second common node in accordance with the baseband signal.

24. A method for converting digital signal to an analog signal, comprising:

receiving a baseband signal having an in-phase component and a quadrature component, and receiving an LO signal having an in-phase LO signal and a quadrature LO signal;

combining the in-phase component and the in-phase LO signal to obtain a first in-phase modulation signal, and combining the quadrature component and the quadrature LO signal to obtain a first quadrature modulation signal; and controlling a plurality of switchable capacitor paths of a first capacitor arrangement in accordance with the first in-phase modulation signal or in accordance with the first quadrature modulation signal, wherein the first capacitor arrangement comprises the plurality of switchable capacitor paths arranged in parallel, wherein each switchable capacitor path comprises a switchable element and a capacitor coupled in series, and wherein the plurality of switchable capacitor paths of the first capacitor arrangement is connected via a first common node.

25. The method according to claim 24, further comprising:

outputting the analog signal via the first common node in accordance with the baseband signal.

26. Method for converting digital signal to an analog signal, comprising:

receiving a baseband signal having an in-phase component and a quadrature component, and receiving an LO signal having an in-phase LO signal and a quadrature LO signal, wherein the in-phase component comprises two in-phase component parts, wherein the quadrature component comprises two quadrature component parts, wherein the in-phase LO signal comprises two in-phase LO signal parts, and wherein the quadrature LO signal comprises two quadrature LO signal parts;

combining a first part of the in-phase component and a first part of the in-phase LO signal to obtain a first in-phase modulation signal, and combining a second part of the in-phase component and a second part of the in-phase LO signal to obtain a second in-phase modulation signal;

combining a first part of the quadrature component and a first part of the quadrature LO signal to obtain a first quadrature modulation signal, and combining a second part of the quadrature component and a second part of the quadrature LO signal to obtain a second quadrature modulation signal;

controlling a plurality of switchable capacitor paths of a first capacitor arrangement in accordance with the first in-phase modulation signal or in accordance with the first quadrature modulation signal, wherein the first capacitor arrangement comprises the plurality of switchable capacitor paths arranged in parallel, wherein each switchable capacitor path comprises a switchable element and a capacitor coupled in series, and wherein the plurality of switchable capacitor paths of the first capacitor arrangement is connected via a first common node;

controlling a plurality of switchable capacitor paths of a second capacitor arrangement in accordance with the second in-phase modulation signal or in accordance with the second quadrature modulation signal, wherein the second capacitor arrangement comprises the plurality of switchable capacitor paths arranged in parallel, wherein each switchable capacitor path comprises a switchable element and a capacitor coupled in series, and wherein the plurality of switchable capacitor paths of the second capacitor arrangement is connected via a second common node; and outputting the analog signal as differential signal between the first and second common node in accordance with the baseband signal.

* * * * *